United States Patent
Li et al.

(10) Patent No.: US 11,181,773 B2
(45) Date of Patent: Nov. 23, 2021

(54) BACKLIGHT MODULE

(71) Applicant: SHENZHEN TCL NEW TECHNOLOGY CO., LTD., Shenzhen (CN)

(72) Inventors: Zelong Li, Shenzhen (CN); Daiqing Wang, Shenzhen (CN); Kewen Qiang, Shenzhen (CN); Honglei Ji, Shenzhen (CN)

( * ) Notice: Subject to any disclaimer, the term of this patent is extended or adjusted under 35 U.S.C. 154(b) by 0 days.

(21) Appl. No.: 17/257,834

(22) PCT Filed: Dec. 17, 2019

(86) PCT No.: PCT/CN2019/125865
§ 371 (c)(1),
(2) Date: Jan. 4, 2021

(87) PCT Pub. No.: WO2020/125606
PCT Pub. Date: Jun. 25, 2020

(65) Prior Publication Data
US 2021/0240040 A1   Aug. 5, 2021

(30) Foreign Application Priority Data
Dec. 18, 2018 (CN) .......................... 201811555215.4

(51) Int. Cl.
*G02F 1/13357* (2006.01)
*G02F 1/1335* (2006.01)
(Continued)

(52) U.S. Cl.
CPC .. *G02F 1/133603* (2013.01); *G02F 1/133605* (2013.01); *G02F 1/133607* (2021.01);
(Continued)

(58) Field of Classification Search
CPC ......... G02F 1/133603; G02F 1/133607; G02F 1/133612; G02F 1/133605; H01L 33/504; H01L 33/60; H01L 33/62
See application file for complete search history.

(56) References Cited

U.S. PATENT DOCUMENTS

2004/0069999 A1   4/2004 Lin et al.
2013/0070168 A1*  3/2013 Yokota .............. G02F 1/133609
                                                   348/790
(Continued)

FOREIGN PATENT DOCUMENTS

CN   201885056 U   6/2011
CN   203949113 U   11/2014
(Continued)

OTHER PUBLICATIONS

The World Intellectual Property Organization (WIPO) International Search Report for PCT/CN2019/125865 dated Mar. 20, 2020 6 Pages (including translation).

*Primary Examiner* — Mary Ellen Bowman

(57) ABSTRACT

A backlight module. The backlight module comprises: an LED chip (1), a transparent support (2), and a packaging adhesive (3); an accommodating groove (21) is provided on the transparent support (2), and the LED chip (1) is provided at the bottom of the accommodating groove (21); the packaging adhesive (3) is located in the accommodating groove (21) and covers a light-exiting surface of the LED chip (1). The LED chip (1) and the packaging adhesive (3) are provided in the accommodating groove (21), so that the transparent support (2) and the packaging adhesive (3) enlarge a light-exiting angle of the LED chip (1), thereby reducing the number of the LED chips (1) in the backlight module and reducing the production costs.

10 Claims, 2 Drawing Sheets

(51) Int. Cl.
*H01L 33/50* (2010.01)
*H01L 33/60* (2010.01)
*H01L 33/62* (2010.01)

(52) U.S. Cl.
CPC ...... *G02F 1/133612* (2021.01); *H01L 33/504* (2013.01); *H01L 33/60* (2013.01); *H01L 33/62* (2013.01)

(56) References Cited

U.S. PATENT DOCUMENTS

| | | | |
|---|---|---|---|
| 2016/0062023 A1* | 3/2016 | Itoh | G02B 6/009 362/608 |
| 2018/0047880 A1* | 2/2018 | Li | H01L 33/56 |
| 2018/0175265 A1* | 6/2018 | Kim | H01L 33/504 |
| 2019/0097091 A1* | 3/2019 | Fan | H01L 33/60 |
| 2020/0227600 A1* | 7/2020 | Watanabe | H01L 25/0753 |

FOREIGN PATENT DOCUMENTS

| | | |
|---|---|---|
| CN | 105140379 A | 12/2015 |
| CN | 107086263 A | 8/2017 |
| CN | 209765224 U | 12/2019 |

\* cited by examiner

BACKLIGHT MODULE

CROSS-REFERENCES TO RELATED APPLICATIONS

This application is a national stage application of PCT application No. PCT/CN2019/125865, filed on Dec. 17, 2019, which claims priority to Chinese Patent Application No. 201811555215.4, filed on Dec. 18, 2018, the content of all of which is incorporated herein by reference.

FIELD OF THE INVENTION

The present disclosure relates to the technical field of liquid crystal display, and, more particularly, to a backlight module.

BACKGROUND

An LED, as a high-efficiency, long-life photoelectric device, has currently been widely used in a plurality of backlight modules including a TV, a mobile phone and more. For a TV application, a light input method for the LED may be divided into two types: an edge-type backlight, and a direct-type backlight. An OD (Optical Distance) thickness is a key indicator for evaluating a direct-type machine, which refers to a distance between a reflector and a lower surface of a diffusion plate. An important parameter of the direct-type backlight is a pitch value, that is, a distance between one LED and another. For a traditional LED, due to adopting an opaque bowl-shaped bracket to condense a light, generally, a light-emitting angle of an LED is about 120 degrees. If adopting the traditional LED directly to a direct-type design with an ultra-multi-partition and ultra-thin OD, due to a small light-emitting angle thereof, the pitch value cannot be pulled very large, thus a 65-inch LED screen may require tens of thousands of or even hundreds of thousands of lamp beads, which greatly increases a cost thereof.

Therefore, the current technology needs to be improved and developed.

BRIEF SUMMARY OF THE DISCLOSURE

According to the above described defects, the purpose of the present disclosure is providing a backlight module, in order to increase a lighting angle of the LED, and then decrease an amount of the LEDs.

A technical solution of the present disclosure to solve the technical problems is as follows:

A backlight module, comprising an LED chip, wherein further comprising a plurality of transparent brackets and a plurality of sealant, the transparent bracket has an accommodation groove arranged, the LED chip is arranged at a bottom of the accommodation groove, the sealant is arranged in the accommodation groove, and covers a light-emitting surface of the LED chip.

The backlight module, wherein a surface of the sealant facing to an opening of the accommodation groove is an arc-shaped surface, and the arc-shaped surface is recessed toward the LED chip.

The backlight module, wherein the accommodation groove is a truncated cone-shaped accommodation groove, and a diameter of a bottom of the truncated cone-shaped accommodation groove is smaller than a diameter of the opening thereof.

The backlight module, wherein the sealant has a plurality of light diffusion particles arranged inside.

The backlight module, wherein the accommodation groove further has a reflector arranged inside, and the reflector locates on the surface of the sealant facing to the opening of the accommodation groove.

The backlight module, wherein the reflector is made of a mixed material comprising $TiO_2$, $SiO_2$ and silica gel.

The backlight module, wherein a side of the reflector facing to the opening of the accommodation groove is a flat surface.

The backlight module, wherein the side of the reflector facing to the opening of the accommodation groove is coplanar with a surface of the transparent bracket.

The backlight module, wherein the side of the reflector facing to the opening of the accommodation groove is an arc-shaped surface, recessing toward the bottom of the accommodation groove.

The backlight module, wherein the side of the reflector facing to the opening of the accommodation groove is an arc-shaped surface, protruding toward the opening of the accommodation groove.

The backlight module, wherein further comprising a PCB board, the transparent brackets are arranged on the PCB board, the LED chip electrically connects to the PCB board, and a side of the PCB board having the transparent brackets mounted on has further a reflective layer arranged.

The backlight module, wherein a side of the transparent bracket away from the PCB board has a diffusion plate and a quantum dot membrane sequentially arranged.

The backlight module, wherein the quantum dot membrane is made of a red quantum dot material and a green quantum dot material.

The backlight module, wherein both the red quantum dot material and the green quantum dot material comprise at least one of a III-V group compound, a II-VI group compound, an all-inorganic cesium lead halide perovskite quantum dot and an organic-inorganic hybrid perovskite material.

The backlight module, wherein a side of the quantum dot membrane away from the PCB board has a composite membrane arranged, the composite membrane comprises at least one of a diffusing piece, a brightening sheet, and a MicroLENS.

Benefits: comparing to the prior art, the present disclosure arranges both the LED chip and the sealant in the accommodation groove, making both the transparent bracket and the sealant expand a light-emitting angle of the LED chip, thereby reducing an amount of the LED chips in the backlight module, and reducing a production cost.

DETAILED DESCRIPTION OF EMBODIMENTS

The present disclosure provides a backlight module, in order to make the purpose, technical solution and the advantages of the present disclosure clearer and more explicit, further detailed descriptions of the present disclosure are stated here, referencing to the attached drawings and some embodiments of the present disclosure. It should be understood that the detailed embodiments of the disclosure described here are used to explain the present disclosure only, instead of limiting the present disclosure.

Figure 1:
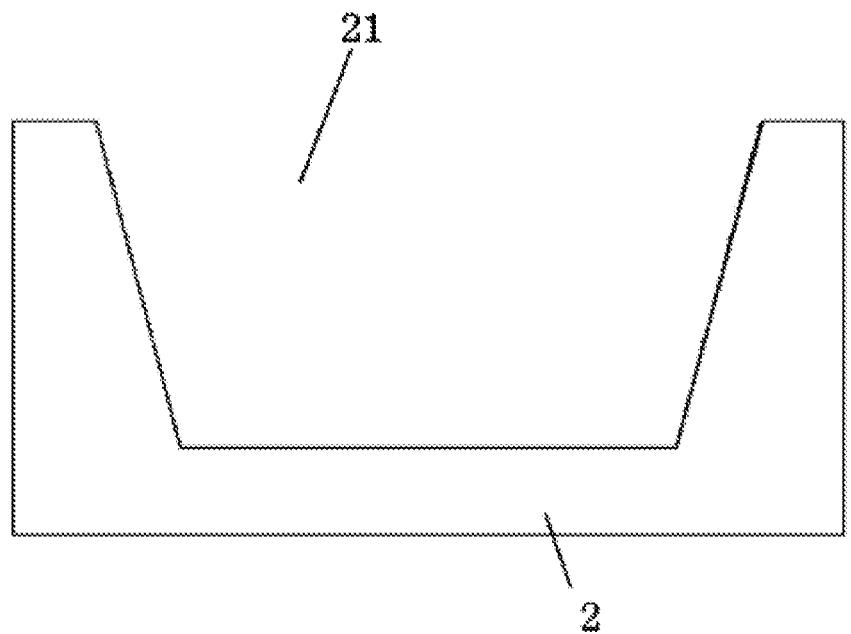
FIG. 1 illustrates a structural schematic diagram on the transparent bracket in the present disclosure.
Figure 2:
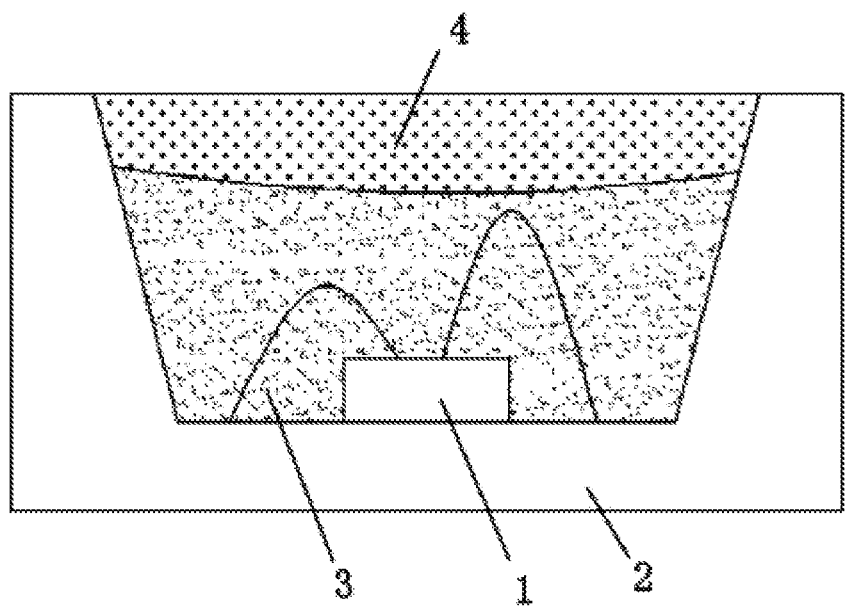
FIG. 2 illustrates a structural schematic diagram on the reflector, the sealant, and the LED chip packaging in the transparent bracket in the present disclosure.

Referencing from FIG. 1 to FIG. 4 at a same time, the present disclosure provides a backlight module, as shown in FIG. 1 and FIG. 2, comprising an LED chip 1, a transparent bracket 2 and a sealant 3, the transparent bracket 2 has an accommodation groove 21 arranged, the LED chip 1 is arranged at a bottom of the accommodation groove 21, the sealant 3 is arranged in the accommodation groove 21, and covers a light-emitting surface of the LED chip 1.

The transparent bracket 2 is applied to holding the LED chip 1 and the sealant 3, making the sealant 3 be able to completely cover the light-emitting surface of the LED chip 1; the transparent bracket 2 is made of a transparent PCT material or a transparent PPA material, due to a transparency thereof, there is no blocking to a light emitted from the LED chip 1, thereby increasing a light-emitting angle of the LED chip 1. The sealant 3 is applied to further increasing the light-emitting angle of the LED chip 1; the sealant 3 may be a transparent silica gel or an epoxy resin sealant.

The present disclosure arranges both the LED chip 1 and the sealant 3 in the accommodation groove 21, making both the transparent bracket 2 and the sealant 3 expand a light-emitting angle of the LED chip 1, thereby reducing an amount of the LED chips 1 in the backlight module, increasing a distance between two adjacent LED chips, and reducing a production cost.

The accommodation groove 21 has a truncated cone shape, a bottom width of the accommodation groove 21 is smaller than an opening width thereof, and the LED chip 1 locates at a bottom thereof. Since the bottom width of the accommodation groove 21 is smaller, making a bottom thickness of the transparent bracket 2 larger, thereby enhancing a supporting strength of the transparent bracket 2 and ensuring a stability of the LED chip 1 and the sealant 3 in the accommodation groove 21, and a strength of the accommodation groove 21 itself.

Since the opening width of the accommodation groove 21 is greater than the bottom width thereof, and the sealant 3 locates on a side of the LED chip 1 facing to an opening of the accommodation groove 21, thus the sealant 3 is able to cover the light-emitting surface of the LED chip 1 more comprehensively, ensuring the light-emitting angle of the LED chip 1 increase.

A shape of the transparent bracket 2 may be selected from a 2016 common bracket shape, a 2835 common bracket shape or a 3030 common bracket shape, thus the transparent bracket 2 may directly use an existing common bracket shape without remanufacturing a mold, further reducing the production cost.

The LED chip 1 is a blue light GaN chip, and a wavelength of a light emitted by the LED chip 1 is 430 nm to 460 nm.

A surface of the sealant 3 facing to the opening of the accommodation groove 21 is an arc-shaped surface, and the arc-shaped surface is recessed toward the LED chip 1, so that a reflection angle is larger when the surface of the sealant 3 facing to the opening of the accommodation groove 21 reflecting the light emitted from the LED chip 1, thereby increasing a light-emitting rate of the light emitted from the LED chip 1.

The sealant 3 has a plurality of light diffusing particles arranged inside, and the light diffusing particles are applied to scattering the light emitted from the LED chip 1 and reducing an irradiation to the transparent bracket 2.

When packaging the LED chip 1 in the accommodation groove 21 by the sealant 3, performing a bake after every two dots of the sealant 3, that is, continuing applying a second layer of the sealant after applying a first layer of the sealant, before performing a bake again, followed by applying two more layers of the sealant. Repeating until a height of the sealant 3 reaches a required height.

The accommodation groove 21 further has a reflector 4 arranged inside, and the reflector 4 locates on a side of the sealant 3 facing to the opening of the accommodation groove 21. The light emitted from the LED chip 1 to the reflector 4, is partially or completely reflected by the reflector 4, which further expands the light-emitting angle of the LED chip 1, thereby reducing an amount of the LED chips 1 and increasing the distance between two adjacent LED chips 1, increasing a pitch value.

The reflector 4 is made of a mixed material comprising $TiO_2$, $SiO_2$ and silica gel, wherein a reflection ratio of the reflector 4 to the light emitted from the LED chip 1 may be adjusted by adjusting a mixing ratio of the $TiO_2$ and the silica gel.

In an embodiment I, wherein a side of the reflector 4 facing to the opening of the accommodation groove 21 is a flat surface, and the flat surface is coplanar with a surface of the transparent bracket 2, reducing a light transmittance at a center of the LED chip 1 and reducing a reflectivity of a center of the sealant 3 to the light emitted from the center of the LED chip 1, to prevent a center of a light spot from being dim when the center of the LED chip 1 is emitting the light before forming the light spot.

In an embodiment II, wherein the side of the reflector 4 facing to the opening of the accommodation groove 21 is an arc-shaped surface, and the arc-shaped surface is recessing toward the bottom of the accommodation groove; comparing to the embodiment I, the present embodiment may further reduce the reflectivity of the center of the sealant 3 to the light emitted from the center of the LED chip 1. Thus when the center of the LED chip 1 is emitting the light outward and forming the light spot, and a center of the light spot is darker, the present embodiment may be adopted.

In an embodiment III, wherein the side of the reflector 4 facing to the opening of the accommodation groove 21 is an arc-shaped surface, and the arc-shaped surface is protruding toward the opening of the accommodation groove 21, increasing a light transparency at the center of the LED chip 1, improving the reflectivity of the center of the sealant 3 to the light emitted from the center of the LED chip 1, to prevent when the center of the LED chip 1 is emitting the light outward and forming the light spot, the center of the light spot is too bright, improving a visual effect.

In a practical implementation, a shape of the side of the reflector 4 facing to the opening of the receiving groove 21 shall be adjusted in coordination with the mixing ratio of the $TiO_2$, the $SiO_2$ and the silica gel, to improve a reflection situation of the light emitted from the LED chip 1. When packaging the LED chip 1 into the transparent bracket 2, after applying the sealant 3, a first baking is performed, then the reflector 4 performs a sealing application, before a second baking.

Figure 3:
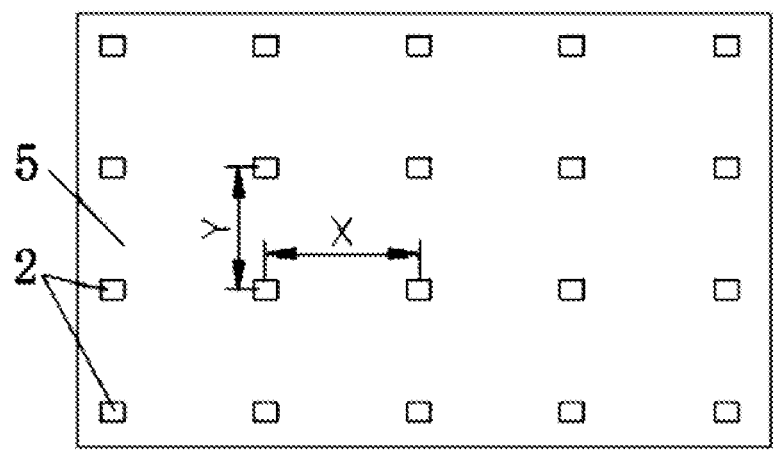
FIG. 3 illustrates a schematic diagram on a distribution of the transparent brackets on the PCB board in the present disclosure.

As shown in FIG. 3, the backlight module further comprises a PCB board 5, the transparent bracket 2 is arranged on the PCB board 5, the LED chip 1 is electrically connected to the PCB board 5, and a face of the PCB board 5 having the transparent bracket 2 arranged further has a reflective layer arranged. The reflective layer may be a white ink layer sprayed or a common reflective film; the reflective layer may reflect the light emitted from the transparent bracket 2 toward a direction of the opening of the accommodation groove 21, so as to make a full use of the light emitted from the LED chip 1. The transparent brackets 2 are arranged into a matrix on the PCB board 5. An embodiment, shown as FIG. 3, a distance X between two adjacent columns of the transparent brackets 2 is 13 mm, and a distance Y between two adjacent rows of the transparent brackets 2 is 11 mm; specifically, a row spacing and a column spacing of the transparent brackets 2 arranged on the PCB board 5 may be adjusted according to a size of the PCB board 5 and a size of the transparent bracket 2.

The PCB board 5 may be an aluminum-based board, a BT board or an FR4 board; in the present disclosure, a solder paste is adopted to solder the transparent bracket 2 on the PCB board 5. When adopting a commonly used tin in a conventional SMT (surface mount technology), a temperature of a reflow soldering is preferably 160° C.

Figure 4:
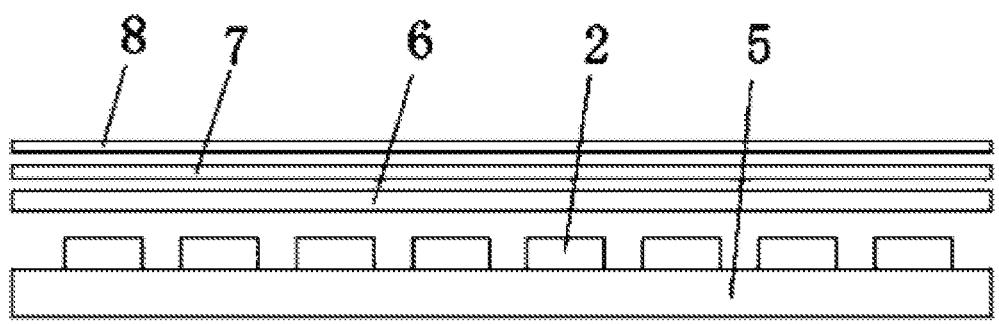
FIG. 4 illustrates a structural schematic diagram on the backlight module in the present disclosure.

Shown as FIG. 4, a side of the transparent bracket 2 away from the PCB board 5 has a diffusion plate 6 and a quantum dot membrane 7 sequentially arranged. The quantum dot membrane 7 is applied to enhancing a color gamut of the backlight module; a distance between the reflective layer and the diffusion plate 6 is 3 mm-8 mm, preferably 5 mm.

The quantum dot membrane 7 is made of a red quantum dot material and a green quantum dot material; both the red quantum dot material and the green quantum dot material comprise at least one of a III-V group compound, a II-VI group compound, an all-inorganic cesium lead halide perovskite quantum dot and an organic-inorganic hybrid perovskite material. Specifically, the III-V group compound comprises CdSe, CdTe, CaSe, MgTe, SrSe, ZnSe, ZnTe, SrTe, MgSe, CaTe, BaSe, BaTe, ZnS, CaS, MgS, SrS, BaS, and CdS; the II-VI group compound comprises GaAs, InN, GaN, GaP, InP and InAs; the all-inorganic cesium lead halide perovskite quantum dot comprises $CsPbX_3$ (wherein X=Cl, Br, I); the organic-inorganic hybrid perovskite material comprises $CH_3NH_3PbX_3$ (wherein X=Cl, Br, I).

A size of the red quantum dot is preferably 4 nm to 10 nm, and a red light peak wavelength excited thereby is 610 nm to 650 nm; a size of the green quantum dot is preferably 2 nm to 7 nm, and a green light peak wavelength excited thereby is 510 nm to 560 nm.

A side of the quantum dot membrane 7 away from the PCB board 5 has a composite membrane 8 arranged, the composite membrane 8 comprises at least one of a diffusing piece, a brightening sheet, and a MicroLENS. When the composite membrane 8 comprises more than two of the diffusing pieces, the brightening sheets, the MicroLENS and a DBEF, there is merely one piece of PET substrate is applied, while overlaying sequentially and arranging more than two of the diffusing pieces, the brightening sheets, and the MicroLENS onto the PET substrate, so as to reducing an amount of the PET substrate, making a thickness of the composite membrane 8 smaller, and improving a wrinkle resistance of the composite membrane 8.

In summary, the present disclosure provides a backlight module, wherein comprising an LED chip, a plurality of transparent brackets, and a plurality of sealant. The transparent bracket has an accommodation groove arranged, the LED chip is arranged at a bottom of the accommodation groove, the sealant is arranged in the accommodation groove, and covers a light-emitting surface of the LED chip.

The present disclosure arranges both the LED chip and the sealant in the accommodation groove, making both the transparent bracket and the sealant expand a light-emitting angle of the LED chip, thereby reducing an amount of the LED chips in the backlight module, and reducing a production cost.

It should be understood that, the application of the present disclosure is not limited to the above examples listed. Ordinary technical personnel in this field can improve or change the applications according to the above descriptions, all of these improvements and transforms should belong to the scope of protection in the appended claims of the present disclosure.

What is claimed is:

1. A backlight module, comprising:
   a transparent bracket provided with an accommodation groove;
   an LED chip arranged at a bottom of the accommodation groove;
   a sealant arranged in the accommodation groove and covering a light-emitting surface of the LED chip; and
   a reflector arranged in the accommodation groove and covering the sealant, wherein a surface of the reflector away from the sealant is an arc-shaped surface, protruding toward an opening of the accommodation groove.

2. The backlight module according to claim 1, wherein a surface of the sealant facing to an opening of the accommodation groove is an arc-shaped surface, and the arc-shaped surface is recessed toward the LED chip.

3. The backlight module according to claim 1, wherein the accommodation groove is a truncated cone-shaped accommodation groove, and a diameter of a bottom of the truncated cone-shaped accommodation groove is less than a diameter of an opening of the truncated cone-shaped accommodation groove.

4. The backlight module according to claim 1, wherein the sealant comprises a plurality of light diffusion particles.

5. The backlight module according to claim 1, wherein the reflector is made of a mixed material comprising $TiO_2$, $SiO_2$, and silica gel.

6. The backlight module according to claim 1, further comprising:
   a PCB board, wherein the transparent bracket is arranged on the PCB board, and the LED chip is electrically connected to the PCB board; and
   a reflective layer arranged on a side of the PCB board where the transparent bracket mounted.

7. The backlight module according to claim 6, further comprising a diffusion plate and a quantum dot membrane sequentially arranged on a side of the transparent bracket away from the PCB board.

8. The backlight module according to claim 7, wherein the quantum dot membrane is made of a red quantum dot material and a green quantum dot material.

9. The backlight module according to claim 8, wherein both the red quantum dot material and the green quantum dot material are selected from a group consisting of an III-V group compound, an II-VI group compound, an all-inorganic cesium lead halide perovskite quantum dot, and an organic-inorganic hybrid perovskite material.

10. The backlight module according to claim 7, further comprising a composite membrane arranged on a side of the quantum dot membrane away from the PCB board, wherein the composite membrane comprises at least one of a diffusing piece, a brightening sheet, and a micro-lens.

* * * * *